US011211958B2

(12) United States Patent
Hitomi et al.

(10) Patent No.: US 11,211,958 B2
(45) Date of Patent: Dec. 28, 2021

(54) RADIO-FREQUENCY CIRCUIT AND COMMUNICATION DEVICE

(71) Applicant: MURATA MANUFACTURING CO., LTD., Kyoto (JP)

(72) Inventors: Shinya Hitomi, Nagaokakyo (JP); Hidenori Obiya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 38 days.

(21) Appl. No.: 16/808,540

(22) Filed: Mar. 4, 2020

(65) Prior Publication Data

US 2020/0287577 A1 Sep. 10, 2020

(30) Foreign Application Priority Data

Mar. 7, 2019 (JP) .............................. JP2019-041661

(51) Int. Cl.
| | | |
|---|---|---|
| H04B 1/04 | (2006.01) | |
| H03F 3/24 | (2006.01) | |
| H03F 3/21 | (2006.01) | |
| H03F 1/02 | (2006.01) | |
| H04B 7/06 | (2006.01) | |
| H04B 1/00 | (2006.01) | |
| H03F 3/195 | (2006.01) | |

(52) U.S. Cl.
CPC ......... *H04B 1/0458* (2013.01); *H03F 1/0233* (2013.01); *H03F 3/195* (2013.01); *H03F 3/211* (2013.01); *H03F 3/245* (2013.01); *H04B 1/0057* (2013.01); *H04B 7/0604* (2013.01); *H03F 2200/451* (2013.01); *H04B 2001/0408* (2013.01)

(58) Field of Classification Search
CPC .. H04B 1/0458; H04B 1/0604; H04B 1/0057; H04B 2001/0408; H04B 7/0604; H03F 1/0233; H03F 3/195; H03F 3/245; H03F 3/211; H03F 2200/451; H03F 3/68
See application file for complete search history.

(56) References Cited

U.S. PATENT DOCUMENTS

| | | | |
|---|---|---|---|
| 2014/0051373 | A1 | 2/2014 | Klomsdorf et al. |
| 2014/0111178 | A1 | 4/2014 | Khlat et al. |
| 2018/0294858 | A1 | 10/2018 | Pehlke |
| 2018/0302047 | A1* | 10/2018 | Igarashi ................ H03F 3/24 |
| 2020/0119705 | A1* | 4/2020 | Camuffo ............... H04L 27/04 |
| 2020/0266766 | A1* | 8/2020 | Khlat ..................... H03F 3/20 |

FOREIGN PATENT DOCUMENTS

JP 2018-182720 A 11/2018

* cited by examiner

*Primary Examiner* — Ankur Jain

(74) *Attorney, Agent, or Firm* — Pearne & Gordon LLP

(57) ABSTRACT

A radio-frequency circuit includes a first power amplifier that amplifies a first transmission signal and outputs the first transmission signal amplified; and a second power amplifier that amplifies a second transmission signal different in frequency from the first transmission signal, and outputs the second transmission signal amplified. At least one of the first power amplifier or the second power amplifier switches from ET mode to APT mode, when (1) both the first power amplifier and the second power amplifier are outputting amplified transmission signals and (2) output power of at least one of the first power amplifier or the second power amplifier is greater than a first threshold power.

18 Claims, 7 Drawing Sheets

APT mode

ET mode

RADIO-FREQUENCY CIRCUIT AND COMMUNICATION DEVICE

CROSS REFERENCE TO RELATED APPLICATION

The present application is based on and claims priority of Japanese Patent Application No. 2019-041661 filed on Mar. 7, 2019. The entire disclosure of the above-identified application, including the specification, drawings and claims is incorporated herein by reference in its entirety.

FIELD

The present disclosure relates to a radio-frequency circuit and a communication device including the radio-frequency circuit.

BACKGROUND

Radio-frequency circuits that support multiband and multimode communication should simultaneously transmit a plurality of radio-frequency signals having different frequencies with high quality.

Patent Literature (PTL) 1 discloses a circuit configuration of a power amplification module including a power amplifier capable of operating according to an envelope tracking method. This enables efficient transmission of radio-frequency signals.

CITATION LIST

Patent Literature

PTL 1: U.S. Unexamined Patent Application Publication No. 2014/0111178

SUMMARY

Technical Problem

As recognized by the present inventor, although the power amplification module (high frequency circuit) disclosed in PTL 1 has a configuration that includes one antenna and one power amplifier, a plurality of power amplifiers are needed in order to simultaneously transmit a plurality of radio-frequency signals having different frequencies.

However, when radio-frequency signals having different frequencies are simultaneously output from the power amplifiers, there are cases where the transmission signal output from one power amplifier leaks into another power amplifier. In such a case, there is the issue that, in the other amplifier, two radio-frequency signals having mutually different frequencies mix, thereby generating intermodulation distortion, and thus radio-frequency signal quality deteriorates.

In view of this, the present disclosure relates to a radio-frequency circuit and a communication device which reduce generation of intermodulation distortion during simultaneous transmission of a plurality of radio-frequency signals amplified by a plurality of power amplifiers.

Solution to Problem

A radio-frequency circuit according to an aspect of the present disclosure includes: a first power amplifier that amplifies a first transmission signal and outputs the first transmission signal amplified; and a second power amplifier that amplifies a second transmission signal different in frequency from the first transmission signal, and outputs the second transmission signal amplified, wherein at least one of the first power amplifier or the second power amplifier switches from an amplification mode according to an envelope tracking method to an amplification mode according to an average power tracking method, when (1) both the first power amplifier and the second power amplifier are outputting amplified transmission signals and (2) a value indicating an output power of at least one of the first power amplifier or the second power amplifier is greater than a first threshold power.

Advantageous Effects

The present disclosure can provide a radio-frequency circuit and a communication device which reduce generation of intermodulation distortion during simultaneous transmission of a plurality of radio-frequency signals amplified by a plurality of power amplifiers.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Hereinafter, exemplary embodiments of the present disclosure will be described in detail with reference to the working example and the drawings. It should be noted that each of the subsequently described exemplary embodiments shows a generic or a specific example. The numerical values, shapes, materials, elements, the arrangement and connection of the elements, and others indicated in the following exemplary embodiments are mere examples, and therefore are not intended to limit the present disclosure. Among the structural components described in the following exemplary embodiments, structural components not recited in any one of the independent claims are described as optional structural components. In addition, the sizes of the elements and the ratio of the sizes illustrated in the drawings are not necessarily accurate.

Embodiment

[1. Configuration of Radio-Frequency Circuit and Communication Device]

Figure 1A:
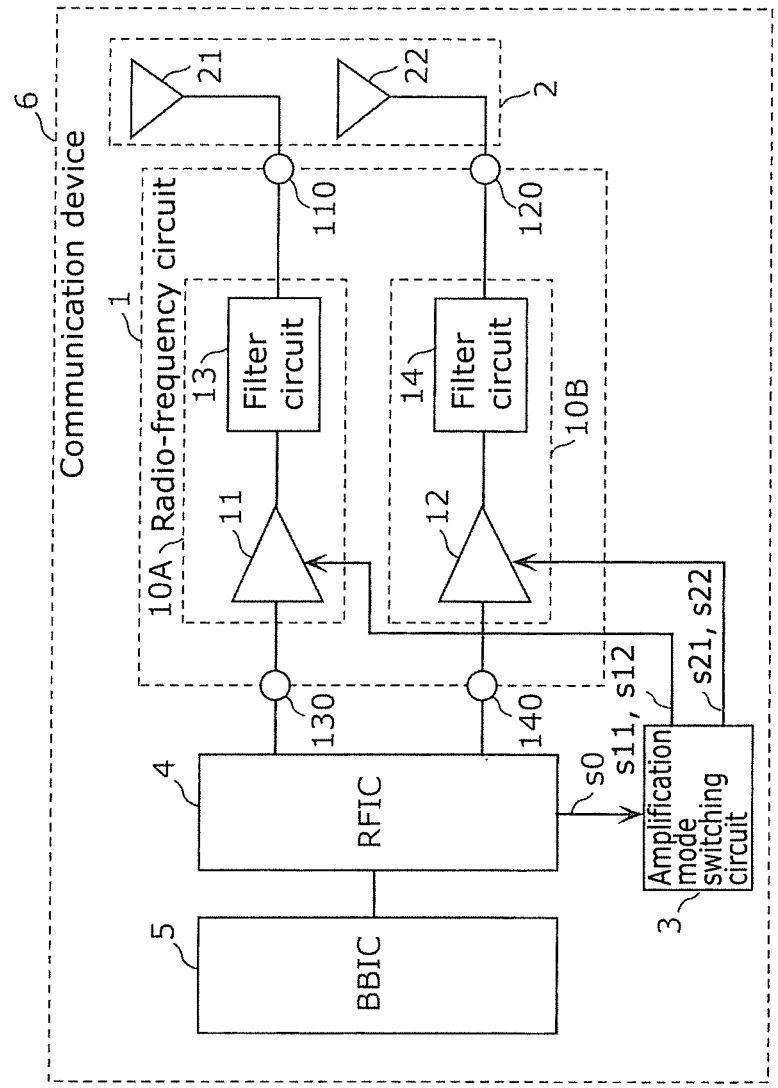
FIG. 1A is a circuit configuration diagram of a radio-frequency circuit and a communication device according to an embodiment.

FIG. 1A is a circuit configuration diagram of radio-frequency circuit 1 and communication device 6 according to an embodiment. As illustrated in the figure, communication device 6 includes radio-frequency circuit 1, antenna circuit 2, amplification mode switching circuit 3, RF signal processing circuit (RFIC) 4, and baseband signal processing circuit (BBIC) 5.

Radio-frequency circuit 1 includes input terminals 130 (first input terminal) and 140 (second input terminal), output terminals 110 (first output terminal) and 120 (second output terminal), and transmission amplifying circuits 10A and 10B.

Transmission amplifying circuit 10A is an example of a first transmission amplifying circuit disposed on a path that connects input terminal 130 and output terminal 110, and includes power amplifier 11 and filter circuit 13. Transmission amplifying circuit 10B is an example of a second transmission amplifying circuit disposed on a path that connects input terminal 140 and output terminal 120, and includes power amplifier 12 and filter circuit 14.

Power amplifier 11 is an example of a first power amplifier that preferentially amplifies a first transmission signal input to input terminal 130 and outputs the amplified first transmission signal to output terminal 110 via filter circuit 13. Filter circuit 13 is connected to the output terminal of power amplifier 11 and to output terminal 110, has a passband including a first frequency, and transmits the first transmission signal having the first frequency with low loss.

Power amplifier 12 is an example of a second power amplifier that preferentially amplifies a second transmission signal input to input terminal 140 and outputs the amplified second transmission signal to output terminal 120 via filter circuit 14. Filter circuit 14 is connected to the output terminal of power amplifier 12 and to output terminal 120, has a passband including a second frequency, and transmits the second transmission signal having the second frequency with low loss.

Each of power amplifiers 11 and 12 includes, for example, a bipolar amplifier transistor having a base terminal, an emitter terminal, and a collector terminal. Each of power amplifiers 11 and 12, for example, includes two or more stages of cascade-connected amplifier transistors; the collector terminal of the kth-stage amplifier transistor is connected to the base terminal of the (k+1)th-stage amplifier transistor. Due to the cascade connection, the base terminal of the front-most stage (first stage) amplifier transistor becomes the input terminal of power amplifier 11 or 12, and the collector terminal of the rear-most stage amplifier transistor becomes the output terminal of power amplifier 11 or 12.

It should be noted that the amplifier transistors included in power amplifiers 11 and 12 are not limited to bipolar transistors, and may be metal-oxide-semiconductor field-effect-transistors (MOSFETs) for example. Furthermore, power amplifiers 11 and 12 may be integrated in a single chip or may use different chips.

A bias signal (a direct current bias voltage or a direct current bias current) is supplied to the base terminal and a direct current power supply voltage is supplied to the collector terminal of each of the amplifier transistors included in each of power amplifiers 11 and 12. Changing (the voltage or current of) the bias signal supplied to the base terminal of each of the amplifier transistors optimizes the operating point of the respective amplifier transistors.

It should be noted that filter circuits 13 and 14, input terminals 130 and 140, and output terminals 110 and 120 are not essential elements of radio-frequency circuit 1 according to this embodiment.

In the above-described configuration, with radio-frequency circuit 1, the first transmission signal amplified by power amplifier 11 from output terminal 110 and the second transmission signal amplified by power amplifier 12 from output terminal 120 can be in a state of transmission at a same point in time.

Here, in radio-frequency circuit 1 according to this embodiment, at least one of power amplifier 11 or 12 switches from an amplification mode according to the envelope tracking (ET) method to an amplification mode according to the average power tracking (APT) method when (1) when both power amplifiers 11 and 12 are outputting the amplified transmission signals, and (2) the value indicating the output power of at least one of power amplifier 11 or 12 is greater than a first threshold power.

Figure 1B:
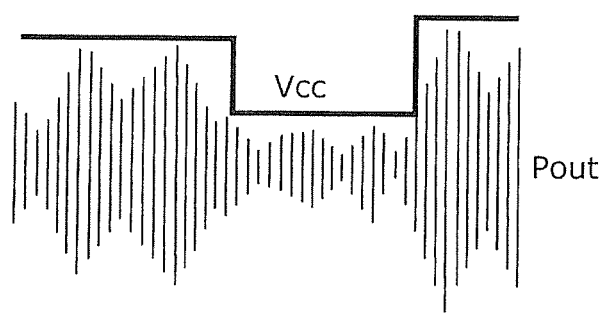
FIG. 1B illustrates schematic waveform diagrams for describing an average power tracking mode and an envelope tracking mode.
Figure 1B:
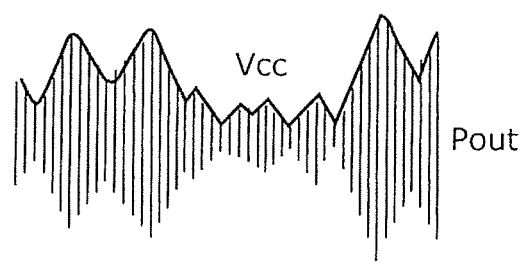

FIG. 1B illustrates schematic waveform diagrams for describing the APT mode and the ET mode. As illustrated in FIG. 1B, the ET mode (i.e., amplification mode according to the ET method) is a mode that tracks the power amplitude (envelope) of the radio-frequency signal, and varies the bias signal (direct current bias voltage or direct current bias current) to be supplied to (the base terminals of the amplifier transistors of) the power amplifier according to the envelope. In contrast, as also illustrated in FIG. 1B, the APT mode (i.e., amplification mode according to the APT method) is a mode that follows the average power amplitude of a radio-frequency signal calculated on a predetermined period basis, and varies the bias signal (direct current bias voltage or direct current bias current) to be supplied to (the base terminals of the amplifier transistors of) the power amplifier according to the average power amplitude.

In a radio-frequency circuit that includes a power amplifier, the power consumption of the power amplifier occupies a large portion of the power consumption of the radio-frequency circuit, and thus, in order to reduce power consumption, improving the efficiency of the power amplifier is a challenge. The ET method is given as a technique of improving the efficiency of the power amplifier. In modulation methods such as orthogonal frequency division multiplexing (OFDM) used in wireless communication, the peak-to-average power ratio (PAPR) of an input signal of a power amplifier increases. In amplifying and transmitting such a modulated signal, for the input signal during peak power, a bias voltage is applied to the amplifier transistor so that the amplifier transistor operates in the compression region. In other words, because the bias voltage becomes excessive during average power, varying the bias voltage according to the input modulated signal of the power amplifier (ET mode) enables the power consumption of the power amplifier to be reduced. In the case of the ET mode, however, since the power amplifier is made to operate in the compression region, signal distortion is generated. In contrast, the APT mode is inferior to the ET mode in terms of reducing power consumption but can reduce the generation of signal distortion compared to the ET mode.

In a radio-frequency circuit including two power amplifiers, when radio-frequency signals having different frequencies are simultaneously transmitted, the output signal of one power amplifier leaks into the other power amplifier, the output signal of the one power amplifier that has leaked-in mixes with the output signal of the other power amplifier, and thus intermodulation distortion (hereinafter sometimes referred to as IMD) is generated. When this intermodulation distortion flows into, for example, another radio-frequency circuit that transfers a radio-frequency signal having the frequency of the intermodulation distortion, there is the problem that the predetermined signal quality in the other radio-frequency circuit cannot be satisfied. Conventionally, when the generated IMD needs to be lower than a standard value, this is handled by reducing the output power from the power amplifiers. However, there is the problem that the required power from the base station cannot be satisfied.

In contrast, in radio-frequency circuit 1 according to this embodiment, at least one of power amplifiers 11 or 12 switches from the ET mode to the APT mode when the value indicating the output power of either power amplifier 11 or 12 is greater than the first threshold. Accordingly, in the region in which the output power of the radio-frequency signal from either output terminal 110 or 120 becomes big, at least one of power amplifier 11 or 12 operates in the APT mode in which generation of signal distortion is reduced, and thus generation of the intermodulation distortion described above can be reduced without reducing the output power of power amplifiers 11 and 12. Therefore, deterioration of signal quality level in radio-frequency circuit 1 and surrounding circuits can be reduced.

Furthermore, in radio-frequency circuit 1 according to this embodiment, each of output terminals 110 and 120 are connected to different antenna elements 21 and 22.

In the configuration in which the respective radio-frequency transmission signals output from transmission amplifying circuits 10A and 10B are transmitted from different antenna elements 21 and 22, the radio-frequency transmission signal emitted from one antenna element leaks into the other antenna element, and the radio-frequency transmission signal transmitted from the transmission amplifying circuit connected to the other antenna element mixes with the radio-frequency transmission signal that has leaked into the other antenna element, and thus intermodulation distortion is generated.

Even in the above-described configuration, in the region in which the output power of the radio-frequency transmission signal becomes big, either power amplifier 11 or 12 switches to and operates in the APT mode in which generation of signal distortion is reduced, and thus generation of the intermodulation distortion described above can be reduced. Therefore, deterioration of signal quality level in radio-frequency circuit 1 and surrounding circuits can be reduced.

Hereinafter, elements included in communication device 6 other than radio-frequency circuit 1 will be described.

Antenna circuit 2 includes antenna elements 21 and 22. Antenna element 21 is connected to output terminal 110 of radio-frequency circuit 1, and preferentially transmits and receives a first transmission signal including a first frequency. Antenna element 22 is connected to output terminal 120 of radio-frequency circuit 1, and preferentially transmits and receives a second transmission signal including a second frequency.

RFIC 4 is an RF signal processing circuit that processes a radio-frequency signal. Specifically, RFIC 4 performs, by upconversion, etc., signal processing on a transmission signal input from BBIC 5, and outputs the radio-frequency transmission signal generated by the signal processing to radio-frequency circuit 1. Furthermore, RFIC 4 includes a controller (e.g., a processor) that outputs a control signal for controlling whether power amplifiers 11 and 12 operate in either the ET mode or the APT mode, based on the value indicating the output power of either power amplifier 11 or 12.

BBIC 5 is a circuit that performs signal processing using an intermediate frequency band having a lower frequency than a radio-frequency signal propagating in radio-frequency circuit 1. The signal processed by BBIC 5 is, for example, used as an image signal for image display or as a sound signal for telephone conversation via a speaker.

RFIC 4 and BBIC 5 are signal processing circuits that process radio-frequency signals.

Amplification mode switching circuit 3 is disposed between the controller of RFIC 4 and power amplifiers 11 and 12. Amplification mode switching circuit 3, based on control signal s0 output from the controller of RFIC 4, (1) switches between supplying bias signal s11 (first bias signal) corresponding to the ET mode to power amplifier 11 and bias signal s12 (second bias signal) corresponding to the APT mode to power amplifier 11, and (2) switches between supplying bias signal s21 (third bias signal) corresponding to the ET mode to power amplifier 12 and bias signal s22 (fourth bias signal) corresponding to the APT mode to power amplifier 12.

According to the above-described configuration of communication device 6, power information of power amplifiers 11 and 12 is received by RFIC 4, and the controller of RFIC 4 determines the amplification mode based on the power information. The controller outputs control signal s0 corresponding to the determined amplification mode to amplification mode switching circuit 3. Amplification mode switching circuit 3 switches between supplying bias signals (s11 or s12, and s21 or s22) for the ET mode or the APT mode to radio-frequency circuit 1, based on aforementioned control signal s0. Therefore, generation of intermodulation distortion described above can be reduced without reducing the output power of power amplifiers 11 and 12, using a simplified circuit configuration.

It should be noted that in communication device 6 according to this embodiment, antenna circuit 2 and BBIC 5 are not essential elements.

Furthermore, the controller that outputs the control signal for controlling whether power amplifiers 11 and 12 operate in either the ET mode or the APT mode need not be included in RFIC 4, and may be included in BBIC 5, or may be included in another element of communication device 6 other than RFIC 4 and BBIC 5.

Furthermore, although, in this embodiment, transmission amplifying circuit 10A and transmission amplifying circuit 10B are connected to different antenna elements 21 and 22, respectively, transmission amplifying circuits 10A and 10B may be connected to the same single antenna element. In this case, output terminals 110 and 120 may be consolidated into a single output terminal.

It should be noted that although, in radio-frequency circuit 1 according to this embodiment, when the value indicating the output power of at least one of power amplifier 11 or 12 is greater than the first threshold power, at least one of power amplifier 11 or 12 switches from the ET mode to the APT mode, the present disclosure is not limited to this configuration.

In the radio-frequency circuit according to the present disclosure, when the value indicating the output power of either power amplifier 11 or 12 is greater than the first threshold power, both power amplifiers 11 and 12 may switch from the ET mode to the APT mode.

Accordingly, in the region in which the output power of the radio frequency signals becomes big, both power amplifiers 11 and 12 transition to the APT mode at the same timing, and thus generation of intermodulation distortion can be most effectively reduced without reducing the output power of power amplifiers 11 and 12.

Furthermore, in the radio-frequency circuit according to the present disclosure, when the value indicating the output power of one of power amplifiers 11 and 12 is greater than the first threshold power, the one of power amplifiers 11 and 12 may switch from the ET mode to the APT mode.

Accordingly, in the region in which the output power of the one of power amplifiers 11 and 12 becomes big, the one of power amplifiers 11 and 12 transitions to the APT mode, and thus generation of intermodulation distortion can be effectively reduced while reducing the signal distortion in the one of power amplifiers 11 and 12 itself.

Furthermore, in the radio-frequency circuit according to the present disclosure, when the value indicating the output power of one of power amplifiers 11 and 12 is greater than the first threshold power, the other of power amplifiers 11 and 12 may switch from the ET mode to the APT mode.

Accordingly, in the region in which the output power of the one of power amplifiers 11 and 12 becomes big, the other of power amplifiers 11 and 12 transitions to the APT mode, and thus generation of intermodulation distortion can be reduced while maintaining low power consumption in the one of power amplifiers 11 and 12.

Furthermore, in radio-frequency circuit 1 according to this embodiment, when the value indicating the output power of at least one of power amplifier 11 or 12 is less than a second threshold power, at least one of power amplifier 11 or 12 may switch from the APT mode to the ET mode. It should be noted that the first threshold power which is the power value when switching from the ET mode to the APT mode and the second threshold power which is the power value when switching from the APT mode to the ET mode may be different or may be the same.

Accordingly, in the region in which the output power of a radio-frequency transmission signal becomes small, at least one of power amplifier 11 or 12 can operate in the ET mode which promotes reduced power consumption.

[2. Configuration of Radio-Frequency Circuit and Communication Device According to a Working Example]

Figure 2:
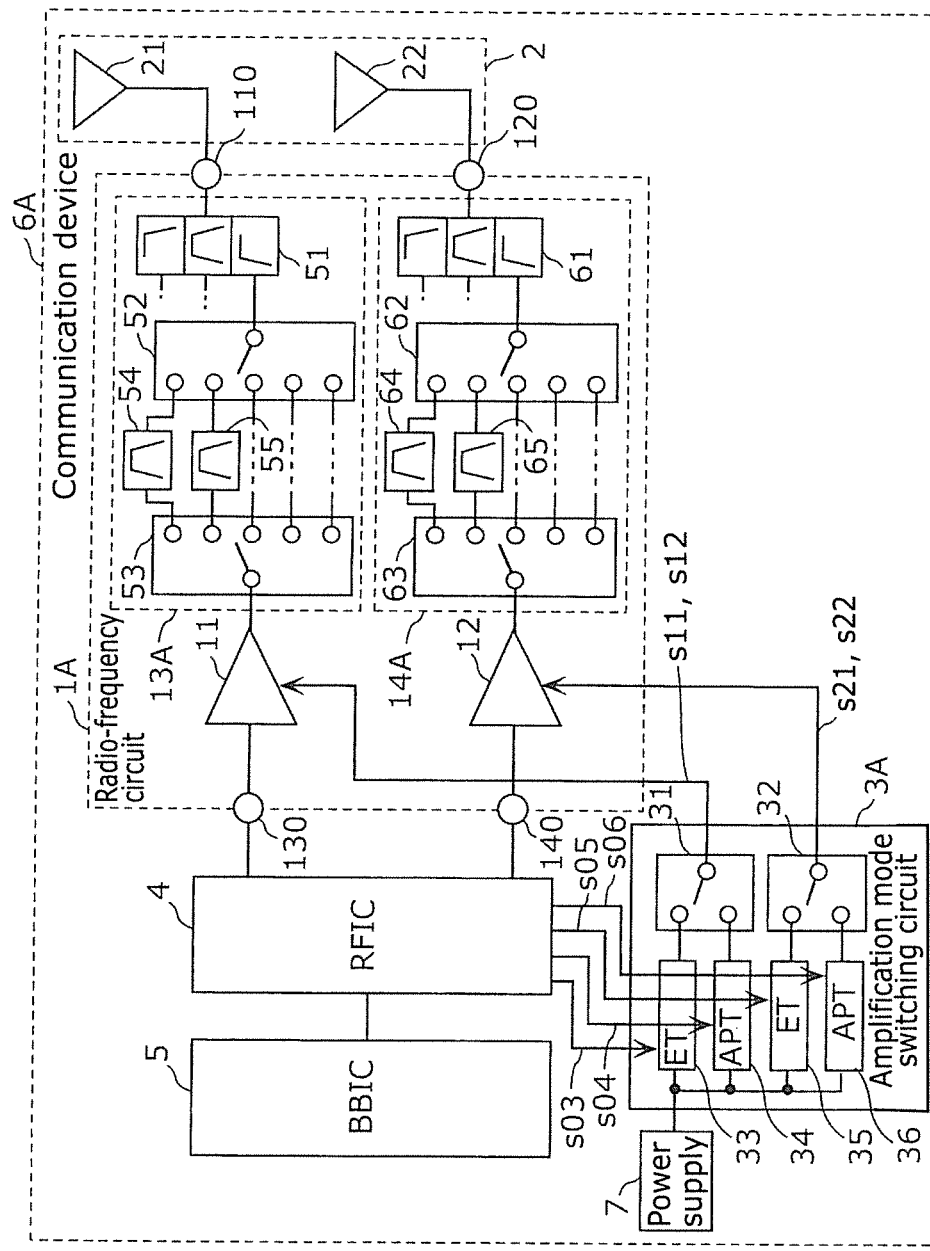
FIG. 2 is a circuit configuration diagram of a radio-frequency circuit and a communication device according to a working example.

FIG. 2 is a circuit configuration diagram of radio-frequency circuit 1A and communication device 6A according to a working example. Radio-frequency circuit 1A and communication device 6A illustrated in the figure are specific circuit configuration examples of radio-frequency circuit 1 and communication device 6 according to the embodiment. Hereinafter, elements of radio-frequency circuit 1A and communication device 6A according to the working example that are the same as those in radio-frequency circuit 1 and communication device 6 according to the embodiment will be omitted, and description will be centered on those elements that are different.

As illustrated in FIG. 2, communication device 6A includes radio-frequency circuit 1A, antenna circuit 2, amplification mode switching circuit 3A, RFIC 4, BBIC 5, and power supply 7.

Radio-frequency circuit 1A includes input terminals 130 (first input terminal) and 140 (second input terminal), output terminals 110 (first output terminal) and 120 (second output terminal), power amplifiers 11 and 12, and filter circuits 13A and 14A. In radio-frequency circuit 1A, power amplifiers 11 and 12 and filter circuits 13A and 14A are mounted on a single mounting board.

Power amplifier 11 and filter circuit 13A are included in a first transmission amplifying circuit disposed in a path that connects input terminal 130 and output terminal 110. Power amplifier 12 and filter circuit 14A are included in a second transmission amplifying circuit disposed in a path that connects input terminal 140 and output terminal 120.

The first transmission amplifying circuit including power amplifier 11 and filter circuit 13A transfers, for example, a radio-frequency transmission signal for the fourth generation communication system (4G). Furthermore, the second transmission amplifying circuit including power amplifier 12 and filter circuit 14A transfers, for example, a radio-frequency transmission signal for the fifth generation communication system (5G). In other words, a first transmission signal is a transmission signal for 4G, and a second transmission signal is a transmission signal for 5G.

Filter circuit 13A is connected to the output terminal of power amplifier 11 and to output terminal 110, has a passband including a first frequency, and transmits a radio-frequency transmission signal having the first frequency with low loss. Filter circuit 13A includes multiplexer 51, switches 52 and 53, and filters 54 and 55. It should be noted that, aside from filters 54 and 55, other filters may be disposed between switches 52 and 53.

Multiplexer 51 includes, for example, a low-pass filter, a bandpass filter, and a high-pass filter. The low-pass filter has as a passband, for example, a frequency band of a communication band belonging to a low band group among 4G-long term evolution (LTE) communication bands. The bandpass filter has as a passband, for example, a frequency band of a communication band belonging to a middle band group among 4G-LTE communication bands. The high-pass filter has as a passband, for example, a frequency band of a communication band belonging to a high band group among 4G-LTE communication bands.

Filter 54 is a bandpass filter having as a passband, for example, the 4G-LTE Band 41 (band: 2496 MHz to 2690 MHz). Furthermore, filter 55 is, for example, a bandpass filter having as a passband, for example, 4G-LTE Band 40 (band: 2300 MHz to 2400 MHz) or Band 30 (transmission band: 2305 MHz to 2315 MHz).

Switch 52 is disposed between multiplexer 51 and filters 54 and 55, and switch 53 is disposed between power amplifier 11 and filters 54 and 55. Switch 52 switches the connection between any of filters 54, 55, etc., and multiplexer 51, based on a control signal from RFIC 4. Switch 53 switches the connection between any of filters 54, 55, etc., and power amplifier 11, based on a control signal from RFIC 4.

Filter circuit 14A is connected to the output terminal of power amplifier 12 and to output terminal 120, has a passband including a second frequency, and transmits a radio-frequency transmission signal having the second frequency with low loss. Filter circuit 14A includes multiplexer 61, switches 62 and 63, and filters 64 and 65. It should be noted that, aside from filters 64 and 65, other filters may be disposed between switches 62 and 63.

Multiplexer 61 includes, for example, a low-pass filter, a bandpass filter, and a high-pass filter. The low-pass filter has as a passband, for example, a frequency band of a communication band belonging to a low band group among 5G-new radio (NR) communication bands. The bandpass filter has as a passband, for example, a frequency band of a communication band belonging to a middle band group among 5G-NR communication bands. The high-pass filter has as a passband, for example, a frequency band of a communication band belonging to a high band group among 5G-NR communication bands.

Filter 64 is a bandpass filter having as a passband, for example, the 5G-NR n41 (band: 2496 MHz to 2690 MHz). Furthermore, filter 65 is a bandpass filter having as a passband, for example, the 5G-NR n40 (band: 2300 MHz to 2400 MHz).

Switch 62 is disposed between multiplexer 61 and filters 64 and 65, and switch 63 is disposed between power amplifier 12 and filters 64 and 65. Switch 62 switches the connection between any of filters 64, 65, etc., and multiplexer 61, based on a control signal from RFIC 4. Switch 63 switches the connection between any of filters 64, 65, etc., and power amplifier 12, based on a control signal from RFIC 4.

In the above-described configuration, with radio-frequency circuit 1A the first transmission signal belonging to 4G-LTE amplified by power amplifier 11 from output terminal 110 and the second transmission signal belonging to 5G-NR amplified by power amplifier 12 from output terminal 120 can be in a state of transmission at a same point in time.

Like radio-frequency circuit 1A according to this working example, in the stage of transitioning from 4G to 5G, a system that causes coexistence of 4G and 5G has been proposed. In this case, for example, a radio-frequency signal in a 4G-LTE communication band and a radio-frequency signal in a 5G-NR communication band are transmitted simultaneously (LTE-Nr dual connectivity: EN-DC). In this system, when the intermodulation distortion generated by the radio-frequency transmission signal for 4G and the radio-frequency transmission signal for 5G exceeds a reference value, the 4G service and 5G service coexistence specification in the third generation partnership project (3GPP) cannot be satisfied. Furthermore, when the frequency of the intermodulation distortion overlaps with the passband of the first transmission amplifying circuit or the second transmission amplifying circuit, the in-band spurious emission specification in 3GPP cannot be satisfied. It should be noted that the 4G service and 5G service coexistence specification in 3GPP and the in-band spurious emission specification in 3GPP are stipulated in TS 38.101-1, for example.

Figure 3:
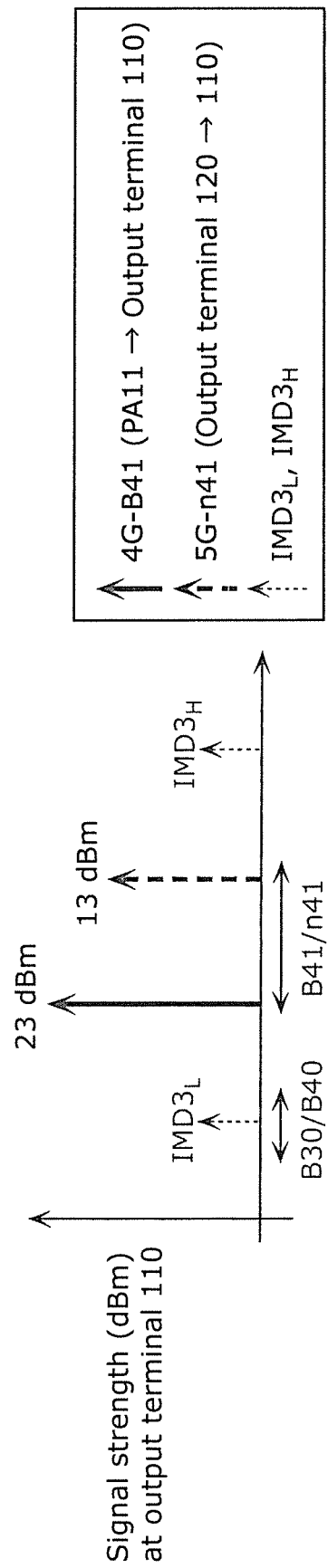
FIG. 3 is an outline diagram representing a first example of a frequency relationship between a 4G-LTE radio-frequency signal, a 5G-NR radio-frequency signal, and intermodulation distortion.

FIG. 3 is an outline diagram representing a first example of a frequency relationship between a 4G-LTE radio-frequency signal, a 5G-NR radio-frequency signal, and intermodulation distortion. The figure indicates the generation of third-order intermodulation distortion in the case where, in radio-frequency circuit A1, the first transmission amplifying circuit transfers a 4G-LTE Band 41 radio-frequency signal and the second transmission amplifying circuit transfers a 5G-NR n41 radio-frequency signal (EN-DC).

It should be noted that, in this case, the first transmission signal transferred in the first transmission amplifying circuit is a signal of a predetermined channel (hereinafter referred to as the first channel) in the 4G-LTE Band 41 (first communication band), and the second transmission signal transmitted by the second transmission amplifying circuit is a signal of a predetermined channel (hereinafter referred to as the second channel) in the 5G-NR n41 (second communication band). The first channel in the 4G-LTE Band 41 and the second channel in the 5G-NR n41 have different central frequencies. Specifically, the first transmission signal is a transmission signal of the first channel in the first communication band stipulated in 4G, and the second transmission signal is a transmission signal of the second channel in the second communication band stipulated in 5G. Here, the first communication band and the second communication band have the same frequency range.

The strength of the 4G radio-frequency transmission signal output from power amplifier 11 is 27 dBm, and, assuming that the propagation loss at filter circuit 13A is 4 dB, the strength of the radio-frequency transmission signal transmitted from antenna element 21 is 23 dBm. In the same manner, the strength of the 5G radio-frequency transmission signal output from power amplifier 12 is 27 dBm, and, assuming that the propagation loss at filter circuit 14A is dB, the strength of the radio-frequency transmission signal transmitted from antenna element 22 is 23 dBm. Here, assuming that the isolation between antenna elements 21 and 22 is 10 dB, the strength of the 5G radio-frequency transmission signal that leaks into antenna element 21 is 13 dBm (=23 dBm−10 dB). In output terminal 110, intermodulation distortion is generated by the 5G radio-frequency transmission signal (strength: 23 dBm) and the 4G radio-frequency transmission signal that has leaked in (strength: 13 dBm).

Here, for example, when the first channel (first frequency f1) in 4G-LTE Band 41 is a channel on the low-frequency side of Band 41 and the second channel (second frequency f2) in 5G-NR n41 is a channel on the high-frequency side of n41, third-order intermodulation distortions $IMD_{3L}$ (frequency: 2f1−f2) and $IMD_{3H}$ (frequency: 2f2−f1) are generated. Of these, third-order intermodulation distortion $IMD_{3L}$ overlaps with 4G-LTE Band 30 or 40. At this time, when filter 55 included in the first transmission amplifying circuit is a circuit that transmits or receives a radio-frequency signal of the 4G-LTE Band 30 or Band 40 or when such a circuit is disposed near radio-frequency circuit 1A, and third-order intermodulation distortion $IMD_{3L}$ exceeds the reference value in 3GPP, the 4G service and 5G service coexistence specification cannot be satisfied, and thus the signal quality in the above-mentioned circuit deteriorates. It should be noted that, aside from the circuit included in the first transmission amplifying circuit, the circuit in which signal quality deterioration occurs due to third-order intermodulation distortion such as that described above may be a circuit connected to multiplexer 51 or a circuit included in the second transmission amplifying circuit. Furthermore, the intermodulation distortion generated by the 4G radio-frequency transmission signal and the 5G radio-frequency transmission signal that has leaked in is not limited to a third-order intermodulation distortion.

In contrast, in radio-frequency circuit 1A according to this working example, at least one of power amplifier 11 or 12 switches from the ET mode to the APT mode when (1) both power amplifiers 11 and 12 are outputting the amplified transmission signals and (2) the value indicating the output power of at least one of power amplifier 11 or 12 is greater than the first threshold power. Accordingly, intermodulation distortion generated by the radio-frequency transmission signal for 4G and the radio-frequency transmission signal for 5G can be reduced. Therefore, the 4G service and 5G service coexistence specification in 3GPP can be satisfied.

Figure 4:
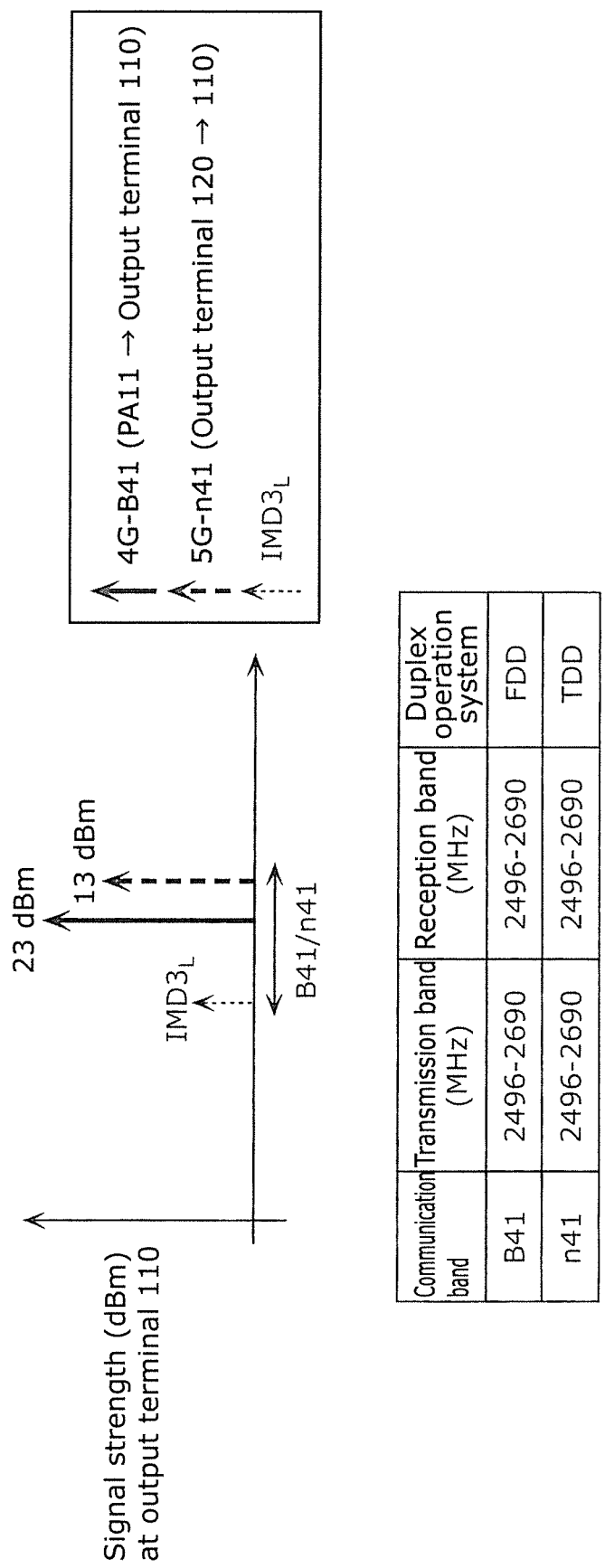
FIG. 4 is an outline diagram representing a second example of a frequency relationship between a 4G-LTE radio-frequency signal, a 5G-NR radio-frequency signal, and intermodulation distortion.

FIG. 4 is an outline diagram representing a second example of a frequency relationship between a 4G-LTE radio-frequency signal, a 5G-NR radio-frequency signal, and intermodulation distortion. The figure indicates the generation of third-order intermodulation distortion in the case where, in radio-frequency circuit 1A, the first transmission amplifying circuit transfers a 4G-LTE Band 41 radio-frequency signal and the second transmission amplifying circuit transfers a 5G-NR n41 radio-frequency signal (EN-DC).

It should be noted that, in this case, the radio-frequency signal transferred in the first transmission amplifying circuit is a signal of a predetermined channel (hereinafter referred to as the first channel) in the 4G-LTE Band 41, and the radio-frequency signal transferred in the second transmission amplifying circuit is a signal of a predetermined channel (hereinafter referred to as the second channel) in the 5G-NR n41. The first channel in the 4G-LTE Band 41 and the second channel in the 5G-NR n41 have different central frequencies.

It should be noted the strengths of the radio-frequency transmission signal for 4G that is output from power amplifier 11 and the radio-frequency transmission signal for 5G that is output from power amplifier 12 are the same as in the first frequency relationship illustrated in FIG. 3.

Here, for example, when the first channel (first frequency f1) in 4G-LTE Band 41 is a channel on the high-frequency side of Band 41 and the second channel (second frequency f2) in 5G-NR n41 is a channel on the high-frequency side of n41, third-order intermodulation distortions $IMD_{3L}$ (frequency: 2f1−f2) and $IMD_{3H}$ (frequency: 2f2−f1) are generated. Of these, third-order intermodulation distortion $IMD_{3L}$ overlaps with the 4G-LTE Band 41 and 5G-NR n41 bands themselves. At this time, when third-order intermodal distortion $IMD_{3L}$ exceeds the reference value in 3GPP, the in-band spurious emission specification in 3GPP cannot be satisfied, and thus signal quality in the first transmission amplifying circuit and the second transmission amplifying circuit deteriorates.

In contrast, in radio-frequency circuit 1A according to this working example, power amplifiers 11 and 12 switch from the ET mode to the APT mode when the value indicating the output power of either power amplifier 11 or 12 is greater than the first threshold power. Accordingly, intermodulation distortion generated by the radio-frequency transmission signal for 4G and the radio-frequency transmission signal for 5G can be reduced. Therefore, the in-band spurious emission specification in 3GPP can be satisfied.

Figure 5:
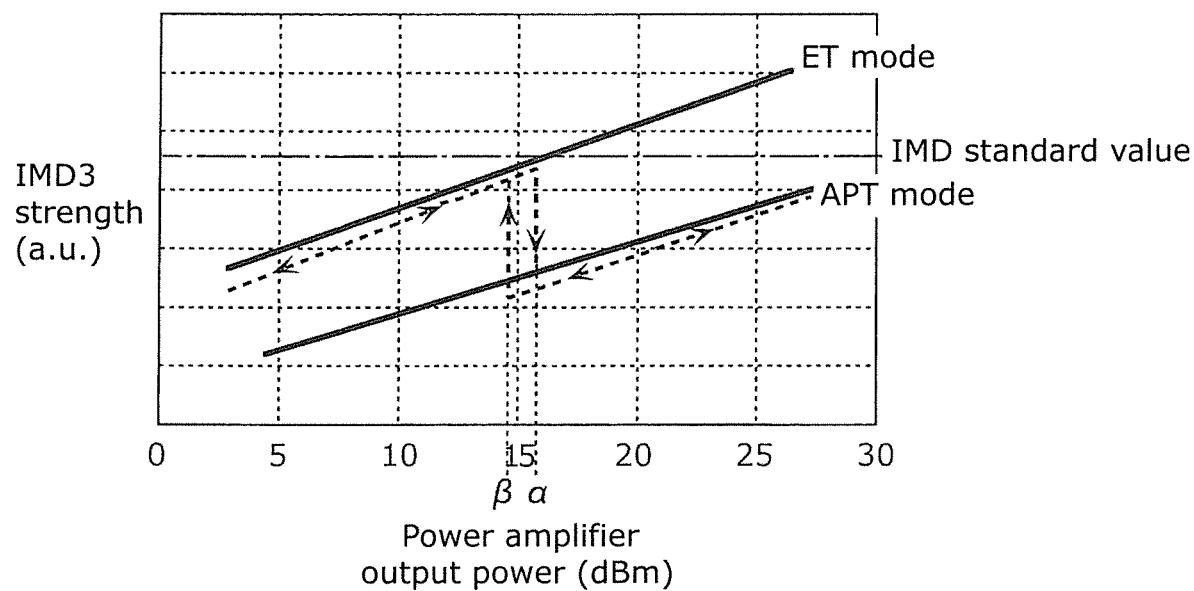
FIG. 5 is a graph describing the switching of amplification modes of the radio-frequency circuit according to the embodiment.

FIG. 5 is a graph describing the switching of amplification modes of radio-frequency circuit 1A according to the working example. The horizontal axis in the figure represents the output power level of output terminals 110 and 120 of the first transmission amplifying circuit and the second transmission amplifying circuit, and the vertical axis in the figure represents the third-order intermodulation distortion (IMD3) when power amplifiers 11 and 12 operate in the ET mode and the third-order intermodulation distortion (IMD3) when power amplifiers 11 and 12 operate in the APT mode.

As illustrated in the figure, in both the ET mode and the APT mode, the third-order intermodulation distortion (IMD3) monotonically increases with an increase in the output power level of the first transmission amplifying circuit and the second transmission amplifying circuit. Furthermore, in the range in which the output power of the first transmission amplifying circuit and the second transmission amplifying circuit is from 0 dBm to 30 dBm, the third-order intermodulation distortion (IMD3) in the ET mode is greater than the third-order intermodulation distortion (IMD3) in the APT mode.

Here, when the output power level of the first transmission amplifying circuit and the second transmission amplifying circuit is approximately 15 dBm or less, importance is placed on reduced power consumption (increased efficiency), and power amplifiers 11 and 12 are caused to operate in the ET mode. At this time, at least one of power amplifiers 11 or 12 switches from the ET mode to the APT mode when the value indicating the output power of at least one of power amplifiers 11 or 12 is greater than first threshold power α (alpha). Accordingly, the strength of the third-order intermodulation distortion (IMD3) can be reduced, and, for example, a value less than the reference value (IMD standard value) in 3GPP can be maintained. Therefore, the 4G service and 5G service coexistence specification in 3GPP and the in-band spurious emission specification in 3GPP can be satisfied.

Furthermore, at least one of power amplifiers 11 or 12 switches from the APT mode to the ET mode when the value indicating the output power of at least one of power amplifiers 11 or 12 is less than second threshold power β (beta). It should be noted that first threshold power α and second threshold power β may be different or may be the same. In addition, first threshold power α may be greater than second threshold power β or may be less than second threshold power β.

Next, a specific configuration example of amplification mode switching circuit 3A included in communication device 6A will be described. Amplification mode switching circuit 3A is disposed between the controller of RFIC 4 and power amplifiers 11 and 12. Amplification mode switching circuit 3A includes switches 31 and 32, ET power supply circuits 33 and 35, and APT power supply circuits 34 and 36.

ET power supply circuit 33 is a bias circuit that is connected to power supply 7 and applies ET mode bias signal s11 to one of the selection terminals of switch 31 based on control signal s03 that is output by the controller of RFIC 4. ET power supply circuit 35 is a bias circuit that is connected to power supply 7 and applies ET mode bias signal s21 to one of the selection terminals of switch 32 based on control signal 505 that is output by the controller of RFIC 4.

APT power supply circuit 34 is a bias circuit that is connected to power supply 7 and applies APT mode bias signal s12 to the other of the selection terminals of switch 31 based on control signal s04 that is output by the controller of RFIC 4. APT power supply circuit 36 is a bias circuit that is connected to power supply 7 and applies APT mode bias signal s22 to the other of the selection terminals of switch 32 based on control signal s06 that is output by the controller of RFIC 4.

Switch 31 is a single-pole double-throw (SPDT) switch that includes one common terminal and two selection terminals; the common terminal is connected to power amplifier 11, the one of the selection terminals is connected to ET power supply circuit 33, and the other of the selection terminals is connected to APT power supply circuit 34.

Switch 32 is a SPDT switch that includes one common terminal and two selection terminals; the common terminal is connected to power amplifier 12, the one of the selection terminals is connected to ET power supply circuit 35, and the other of the selection terminals is connected to APT power supply circuit 36.

It should be noted that ET power supply circuits 33 and 35 need not be separate power supply circuits, and may be a single power supply circuit. In this case, the aforementioned single power supply circuit has a circuit configuration that allows distribution of ET mode bias signals to switches 31 and 32. Furthermore, APT power supply circuits 34 and 36 need not be separate power supply circuits, and may be a single power supply circuit. In this case, the aforementioned single power supply circuit has a circuit configuration that allows distribution of APT mode bias signals to switches 31 and 32.

Moreover, ET power supply circuit 33 and APT power supply circuit 34 need not be separate power supply circuits, and may be a single power supply circuit. In this case, switch 31 becomes unnecessary, and the aforementioned single power supply circuit has a circuit configuration that allows application of an ET mode bias signal and an APT mode bias signal to power amplifier 11 by time division. Moreover, ET power supply circuit 35 and APT power supply circuit 36 need not be separate power supply circuits, and may be a single power supply circuit. In this case, switch 32 becomes unnecessary, and the aforementioned single power supply circuit has a circuit configuration that allows application of an ET mode bias signal and an APT mode bias signal to power amplifier 12 by time division.

Furthermore, power supply 7 is for generating the bias signals output by ET power supply circuits 33 and 35 and APT power supply circuits 34 and 36. Power supply 7 need not be included in communication device 6A and may be provided outside thereof.

Amplification mode switching circuit 3A, based on control signals s03 to s06 output from the controller of RFIC 4, (1) switches between supplying bias signal s11 (first bias signal) corresponding to the ET mode to power amplifier 11 and bias signal s12 (second bias signal) corresponding to the APT mode to power amplifier 11, and (2) switches between supplying bias signal s21 (third bias signal) corresponding to the ET mode to power amplifier 12 and bias signal s22 (fourth bias signal) corresponding to the APT mode to power amplifier 12.

RFIC 4 includes the controller that outputs a control signal for causing at least one of power amplifier 11 or 12 to switch from the ET mode to the APT mode, when the value indicating the output power of at least one of power amplifier 11 or 12 is greater than the first threshold power. The controller of RFIC 4, for example, obtains the power value corresponding to the output power of power amplifier 11 by measuring power using a coupler disposed in a path from the output terminal of power amplifier 11 to antenna element 21. Furthermore, the controller of RFIC 4, for example, obtains the power value corresponding to the output power of power amplifier 12 by measuring power using a coupler disposed in a path from the output terminal of power amplifier 12 to antenna element 22. In this manner, in the case of obtaining the measurement results for the output power of power amplifiers 11 and 12, the controller outputs a control signal for causing at least one of power amplifier 11 or 12 to switch from the ET mode to the APT mode when the value indicating the output power of at least one of power amplifier 11 or 12 is greater than the first threshold power.

It should be noted that the way in which the controller of RFIC 4 obtains the power values corresponding to the output power of the power amplifiers may be by measurement using a power-measuring device other than a coupler. Furthermore, the controller of RFIC 4 may obtain, as a value indicating the output power of a power amplifier, a required power sent from a mobile system base station which is the output power required from a radio-frequency transmission signal transmitted from communication device 6A. In this manner, in the case of predicting the output power of power amplifiers 11 and 12 based on the required power sent from a mobile system base station, the controller outputs a control signal for causing at least one of power amplifier 11 or 12 to switch from the ET mode to the APT mode when the value indicating the output power of at least one of power amplifier 11 or 12 is greater than the first threshold power.

According to the above-described configuration of communication device 6A, generation of intermodulation distortion described above can be reduced without reducing the output power of power amplifiers 11 and 12, using a simplified circuit configuration.

It should be noted that although amplification mode switching circuit 3A is included in communication device 6A and is outside radio-frequency circuit 1A in this working example, the present disclosure is not limited to this configuration. Radio-frequency circuit 1A may include amplification mode switching circuit 3A. In addition, radio-frequency circuit 1A may include switches 31 and 32 of amplification mode switching circuit 3A. In other words, switches 31 and 32 may be mounted on the mounting board of radio-frequency circuit 1A. Specifically, radio-frequency circuit 1 according to this embodiment may further include switch 31 (first switch circuit) that switches between the supply of bias signal s11 (first bias signal) corresponding to the ET mode to power amplifier 11 and the supply of bias signal s12 (second bias signal) corresponding to the APT mode to power amplifier 11, and switch 32 (second switch circuit) that switches between the supply of bias signal s21 (third bias signal) corresponding to the ET mode to power amplifier 12 and the supply of bias signal s22 (fourth bias signal) corresponding to the APT mode to power amplifier 12.

The amplification mode of output amplifiers 11 and 12 is determined by the supply specification of the bias signals for the amplifier transistors included in output amplifiers 11 and 12. According to the above-described configuration, the supply of bias signals to output amplifiers 11 and 12 can be switched by switches 31 and 32 included in radio-frequency circuit 1, and thus radio-frequency circuit 1 capable of switching amplification modes using a simplified circuit configuration can be realized.

Furthermore, although the case where the first transmission signal for 4G and the second transmission signal for 5G are transmitted simultaneously in radio-frequency circuit 1A according to this working example is exemplified, radio-frequency circuit 1 according to this embodiment can also be applied to the case of simultaneously transmitting radio-frequency signals of two different communication bands which are for communication systems of the same generation (what is called carrier aggregation).

Furthermore, although in radio-frequency circuit 1A, power amplifiers 11 and 12 and filter circuits 13A and 14A are mounted on a single mounting board, in radio-frequency circuit 1 according to the present disclosure, power amplifiers 11 and 12 and filter circuits 13A and 14A may be mounted on different mounting boards.

Next, the operation for switching the amplification mode of radio-frequency circuit 1A performed by communication device 6A will be described.

Figure 6:
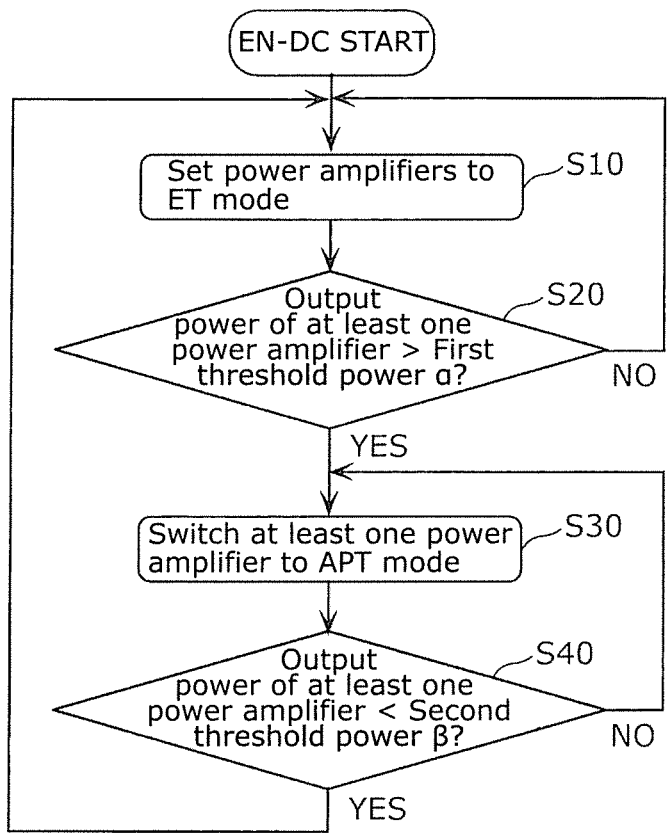
FIG. 6 is a flowchart indicating the amplification mode switching operation of the communication device according to the working example.

FIG. 6 is a flowchart indicating the amplification mode switching operation of communication device 6A according to the working example.

First, the simultaneous transmission of a 4G (LTE) Band 41 radio-frequency signal and a 5G (NR) n41 radio-frequency signal (EN-DC) is started.

The controller of RFIC 4 sets the amplification mode of output amplifiers 11 and 12 to the ET mode (S10). More specifically, the controller of RFIC 4 outputs control signals s03 to s06 to amplification mode switching circuit 3A. Amplification mode switching circuit 3A supplies bias signal s11 (first bias signal) corresponding to the ET mode to power amplifier 11, based on control signals s03 and s04. Amplification mode switching circuit 3A supplies bias signal s21 (third bias signal) corresponding to the ET mode to power amplifier 12, based on control signals 505 and s06.

Next, the controller of RFIC 4 determines whether the value indicating the output power of at least one of power amplifier 11 or 12 is greater than first threshold power α (alpha) (S20). When the values indicating the output power of output amplifiers 11 and 12 are not greater than first threshold power α (NO in S20), the controller of RFIC 4 keeps the amplification mode of output amplifiers 11 and 12 in the ET mode. It should be noted that first threshold power α is power that satisfies the IMD specification, and is, for example, obtained in advance and stored in a memory inside RFIC 4. Furthermore, first threshold power α is not limited to a fixed value, and may be a value that is specified each time from a base station.

On the other hand, when the value indicating the output power of at least one of power amplifier 11 or 12 is greater than first threshold power α (YES in S20), the controller of RFIC 4 switches the amplification mode of at least one of power amplifier 11 or 12 to the APT mode (S30). More specifically, the controller of RFIC 4 outputs control signals s03 to s06 to amplification mode switching circuit 3A. Amplification mode switching circuit 3A supplies bias signal s12 (second bias signal) corresponding to the APT mode to power amplifier 11, based on control signals s03 and s04. Furthermore, amplification mode switching circuit 3A supplies bias signal s22 (fourth bias signal) corresponding to the APT mode to power amplifier 12, based on control signals 505 and s06.

Next, the controller of RFIC 4 determines whether the value indicating the output power of at least one of power amplifier 11 or 12 is less than second threshold power β (beta) (S40). When the value indicating the output power of at least one of output amplifier 11 or 12 is not less than second threshold power β (NO in S40), the controller of RFIC 4 keeps the amplification mode of the at least one of output amplifier 11 or 12 in the APT mode. It should be noted that second threshold power β is power that satisfies the IMD specification, and is, for example, obtained in advance and stored in a memory inside RFIC 4. Furthermore, second threshold power β is not limited to a fixed value, and may be a value that is specified each time from a base station.

On the other hand, when the value indicating the output power of at least one of power amplifier 11 or 12 is less than second threshold power β (YES in S40), the controller of RFIC 4 switches the amplification mode of the at least one of power amplifier 11 or 12 to the ET mode. More specifically, the controller of RFIC 4 outputs control signals s03 to s06 to amplification mode switching circuit 3A. Amplification mode switching circuit 3A supplies bias signal s11 (first bias signal) corresponding to the ET mode to power amplifier 11, based on control signals s03 and s04. Amplification mode switching circuit 3A supplies bias signal s21 (third bias signal) corresponding to the ET mode to power amplifier 12, based on control signals 505 and s06.

It should be noted that although, in communication device 6A according to this working example, when the value indicating the output power of at least one of power amplifier 11 or 12 is greater than first threshold power α, at least one of power amplifier 11 or 12 switches from the ET mode to the APT mode, the present disclosure is not limited to this configuration.

In the communication device according to the present disclosure, when the value indicating the output power of at least one of power amplifier 11 or 12 is greater than first threshold power α, both power amplifiers 11 and 12 may switch from the ET mode to the APT mode. It should be noted that, in this case, both power amplifiers 11 and 12 may switch from the ET mode to the APT mode at the same timing, or they may switch at different timings.

Furthermore, in the communication device according to the present disclosure, when the value indicating the output power of one of power amplifiers 11 and 12 is greater than first threshold power α, the one of power amplifiers 11 and 12 may switch from the ET mode to the APT mode.

Furthermore, in the communication device according to the present disclosure, when the value indicating the output power of one of power amplifiers 11 and 12 is greater than first threshold power α, the other of power amplifiers 11 and 12 may switch from the ET mode to the APT mode.

Furthermore, although in communication device 6A according to this working example, when the value indicating the output power of at least one of power amplifier 11 or 12 is less than second threshold power β, at least one of power amplifier 11 or 12 switches from the APT mode to the ET mode, the present disclosure is not limited to this configuration.

In the communication device according to the present disclosure, when the value indicating the output power of at least one of power amplifier 11 or 12 is less than second threshold power β, both power amplifiers 11 and 12 may switch from the APT mode to the ET mode.

Furthermore, in the communication device according to the present disclosure, when the value indicating the output power of one of power amplifiers 11 and 12 is less than second threshold power β, the one of power amplifiers 11 and 12 may switch from the APT mode to the ET mode.

Furthermore, in the communication device according to the present disclosure, when the value indicating the output power of one of power amplifiers 11 and 12 is less than second threshold power β, the other of power amplifiers 11 and 12 may switch from the APT mode to the ET mode.

It should be noted that first threshold power α, which is the power value when switching from the ET mode to the APT mode, and second threshold power β, which is the power value when switching from the APT mode to the ET mode, may be different or may be the same.

Other Embodiments

Although the radio-frequency circuit and the communication device according to the present disclosure has been described above based on an exemplary embodiment and a working example thereof, the radio-frequency circuit and the communication device according to the present disclosure are not limited to the foregoing embodiment and working example thereof. The present invention also encompasses other embodiments achieved by combining arbitrary elements in the above embodiment and working example thereof, variations resulting from various modifications to the embodiment and working example thereof that may be conceived by those skilled in the art without departing from the essence of the present disclosure, and various devices that include the radio-frequency circuit and the communication device according to the present disclosure.

It should be noted that the radio-frequency circuit and the communication device according to the foregoing embodiment are applied to a communication system such as 3GPP as described above, and are typically applied to a system that simultaneously transmits a 4G-LTE radio-frequency signal and a 5G-NR radio-frequency signal as illustrated in the working example. Specifically, the communication band to be used in the radio-frequency circuit and the communication device according to the foregoing embodiment is a communication band stipulated by 3GPP. For example, the following can be given as examples of a first communication band/second communication band combination: (1) 4G-LTE Band 41/5G-NR n41, (2) 4G-LTE Band 71/5G-NR n71, (3) 4G-LTE Band 3/5G-NR n3, etc.

In addition, the following can be given as examples of a first communication band/second communication band combination: (4) 4G-LTE licensed band/wireless local area network (WLAN), (5) 4G-LTE unlicensed band (4G-LTE-U)/WLAN, (6) 5G-NR licensed band/WLAN, (7) 5G-NR unlicensed band (5G-NR-U)/WLAN, and (8) license band/unlicensed band.

Furthermore, radio-frequency circuit and the communication device according to the foregoing embodiment can be applied to a system that simultaneously transmits a 4G-LTE first communication band and a 5G-NR second communication band of different frequency bands or a system that simultaneously transmits a 4G-LTE first communication band and a 4G-LTE second communication band of different frequency bands.

Table 1 shows examples of correspondence between 4G-LTE and 5G-NR communication bands which can be applied as a first communication band for radio-frequency signals transferred in the first transmission amplifying circuit and a second communication band for radio-frequency signals transferred in the second transmission amplifying circuit shown in the foregoing embodiment, and specific examples of intermodulation distortion therebetween.

the radio-frequency circuit and communication device according to the foregoing embodiment and the working example thereof.

Furthermore, for example, in the radio-frequency circuit and communication device according to the foregoing embodiment and the working example thereof, another radio-frequency circuit element and wiring may be inserted in a path connecting circuit elements, a path connecting a circuit element and a signal path, and a path connecting signal paths which are disclosed in the drawings.

Furthermore, the controller according to the present disclosure may be realized as an integrated circuit (IC) or large scale integration (LSI). Furthermore, the method of implementation of structural elements using an integrated circuit may be realized using a dedicated circuit or a general-purpose processor. A field programmable gate array (FPGA) that allows for programming after the manufacture of an LSI, or a reconfigurable processor that allows for reconfiguration of the connection and the setting of circuit cells inside an LSI may be employed. When circuit integration technology that replaces LSIs comes along owing to advances of the semiconductor technology or to a separate derivative technology, the function blocks may understandably be integrated using that technology.

Although only some exemplary embodiments of the present disclosure have been described in detail above, those skilled in the art will readily appreciate that many modifi-

TABLE 1

| | First commun- ication band | Second commun- ication band | Tx1 (MHz) | Tx2 (MHz) | Rx1 (MHz) | Rx2 (MHz) | IMD 2Tx1-Tx2 2Tx2-Tx1 (MHz) | IMD Tx1-Tx2 Tx2-Tx1 (MHz) | Band over- lapped by IMD |
|---|---|---|---|---|---|---|---|---|---|
| Ex. 1 | n1 | B3 | 1950 | 1760 | 2140 | 1855 | 2140 | 190 | B1(n1)-Rx |
| Ex. 2 | B2 | n66 | 1860 | 1780 | 1940 | 2180 | 1940 | 80 | B2(n2)-Rx |

Furthermore, as frequencies of intermodulation distortion caused by two radio-frequency transmission signals, (Tx1 and Tx2), $2f_{Tx1}-f_{Tx2}$, $2f_{Tx2}-f_{Tx1}$, $f_{Tx1}-f_{Tx2}$, and $f_{Tx2}-f_{Tx1}$ are typically given as shown in Table 1, but aside from these, frequencies stipulated by $mf_{Tx1}\pm nf_{Tx2}$ and $mf_{Tx2}\pm nf_{Tx1}$ (m and n are natural numbers) are also included.

Furthermore, although in radio-frequency circuit 1A according to the working example, power amplifiers 11 and 12 are mounted in a single mounting board, in the radio-frequency circuit according to the present disclosure, power amplifiers 11 and 12 may be mounted in mutually different mounting boards. Furthermore, in the radio-frequency circuit according to the present disclosure, power amplifiers 11 and 12 may be included in mutually different modules. Moreover, in the radio-frequency circuit according to the present disclosure, power amplifiers 11 and 12 may be included in mutually different mobile system base terminals.

Furthermore, although in the foregoing embodiment and working example thereof, a configuration for the case of simultaneously using two different communication bands was given as an example, the radio-frequency circuit and the communication device according to the present disclosure can also be applied to a configuration for the case of simultaneously using three or more different communication bands. In other words a radio-frequency circuit or communication device that simultaneously uses three or more different communication bands and includes the elements of cations are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as a mobile phone, as a multiband/multimode-compatible front-end module employing the carrier aggregation method.

The invention claimed is:
1. A radio-frequency circuit, comprising:
a first power amplifier configured to amplify a first transmission signal and to output a first amplified transmission signal; and
a second power amplifier configured to amplify a second transmission signal having a different frequency than the first transmission signal, and to output a second amplified transmission signal, wherein:
when (1) both the first power amplifier and the second power amplifier output the first and second amplified transmission signals, respectively, and (2) a value indicating an output power of the first power amplifier or the second power amplifier is greater than a first threshold power, the first power amplifier or the second power amplifier is configured to switch from an enve- lope tracking amplification mode to an average power tracking amplification mode, the first transmission signal is of a fourth generation communication system (4G), the second transmission signal is of a fifth generation communication system (5G), the first transmission signal is of a first channel in a first communication band of the fourth generation communication system, the second transmission signal is of a second channel in a second communication band of the fifth generation communication system, and the second communication band has a same frequency range as the first communication band.

2. The radio-frequency circuit according to claim 1, further comprising:

a first output terminal through which the first amplified transmission signal is output; and a second output terminal through which the second amplified transmission signal is output, wherein the first output terminal and the second output terminal are connected to mutually different antennas.

3. The radio-frequency circuit according to claim 1, wherein both the first power amplifier and the second power amplifier are configured to switch from the envelope tracking amplification mode to the average power tracking amplification mode when the value indicating the output power of the first power amplifier or the second power amplifier is greater than the first threshold power.

4. The radio-frequency circuit according to claim 1, wherein one of the first power amplifier or the second power amplifier is configured to switch from the envelope tracking amplification mode to the average power tracking amplification mode when a value indicating the output power of the one of the first power amplifier or the second power amplifier is greater than the first threshold power.

5. The radio-frequency circuit according to claim 1, wherein one of the first power amplifier or the second power amplifier is configured to switch from the envelope tracking amplification mode to the average power tracking amplification mode when a value indicating the output power of the other of the first power amplifier or the second power amplifier is greater than the first threshold power.

6. The radio-frequency circuit according to claim 1, wherein the first power amplifier or the second power amplifier is configured to switch from the average power tracking amplification mode to the envelope tracking amplification mode when a value indicating an output power of the first power amplifier or the second power amplifier is less than a second threshold power.

7. A radio-frequency circuit, comprising:

a first power amplifier configured to amplify a first transmission signal and to output a first amplified transmission signal;

a second power amplifier configured to amplify a second transmission signal having a different frequency than the first transmission signal, and to output a second amplified transmission signal, wherein when (1) both the first power amplifier and the second power amplifier output the first and second amplified transmission signals, respectively, and (2) a value indicating an output power of the first power amplifier or the second power amplifier is greater than a first threshold power, the first power amplifier or the second power amplifier is configured to switch from an envelope tracking amplification mode to an average power tracking amplification mode;

a first switch circuit comprising a first terminal to which a first bias signal corresponding to the envelope tracking amplification mode of the first power amplifier is applied, and a second terminal to which a second bias signal corresponding to the average power tracking amplification mode of the first power amplifier is applied; and a second switch circuit comprising a third terminal to which a third bias signal corresponding to the envelope tracking amplification mode of the second power amplifier is applied, and a fourth terminal to which a fourth bias signal corresponding to the average power tracking amplification mode of the second power amplifier is applied.

8. The radio-frequency circuit according to claim 7, further comprising:

a first output terminal through which the first amplified transmission signal is output; and a second output terminal through which the second amplified transmission signal is output, wherein the first output terminal and the second output terminal are connected to mutually different antennas.

9. The radio-frequency circuit according to claim 7, wherein both the first power amplifier and the second power amplifier are configured to switch from the envelope tracking amplification mode to the average power tracking amplification mode when the value indicating the output power of the first power amplifier or the second power amplifier is greater than the first threshold power.

10. The radio-frequency circuit according to claim 7, wherein one of the first power amplifier or the second power amplifier is configured to switch from the envelope tracking amplification mode to the average power tracking amplification mode when a value indicating the output power of the one of the first power amplifier or the second power amplifier is greater than the first threshold power.

11. The radio-frequency circuit according to claim 7, wherein one of the first power amplifier or the second power amplifier is configured to switch from the envelope tracking amplification mode to the average power tracking amplification mode when a value indicating the output power of the other of the first power amplifier or the second power amplifier is greater than the first threshold power.

12. The radio-frequency circuit according to claim 7, wherein the first power amplifier or the second power amplifier is configured to switch from the average power tracking amplification mode to the envelope tracking amplification mode when a value indicating an output power of the first power amplifier or the second power amplifier is less than a second threshold power.

13. A communication device, comprising:

a signal processing circuit configured to process a radio-frequency signal;

a radio-frequency circuit configured to receive the radio-frequency signal processed by the signal processing circuit; and a mode switching circuit, wherein the radio frequency circuit comprises:

a first power amplifier configured to amplify a first transmission signal and to output a first amplified transmission signal; and a second power amplifier configured to amplify a second transmission signal having a different frequency than the first transmission signal, and to output a second amplified transmission signal, wherein when (1) both the first power amplifier and the second power amplifier output the first and second amplified transmission signals, respectively, and (2) a value indicating an output power of the first power amplifier or the second power amplifier is greater than a first threshold power, the first power amplifier or the second power amplifier is configured to switch from an envelope tracking amplification mode to an average power tracking amplification mode, wherein the signal processing circuit comprises a controller configured to output, based on the value indicating the output power of the first power amplifier or the second power amplifier, a control signal for controlling (1) whether the first power amplifier operates in the envelope tracking amplification mode or the average power tracking amplification mode, and (2) whether the second power amplifier operates in the envelope tracking amplification mode or the average power tracking amplification mode, and wherein the mode switching circuit is disposed between the first power amplifier and the second power amplifier, and is configured to, based on the control signal output from the controller, (1) selectively supply the first bias signal corresponding to the envelope tracking amplification mode to the first power amplifier or supply the second bias signal corresponding to the average power tracking amplification mode to the first power amplifier, and (2) selectively supply the third bias signal corresponding to the envelope tracking amplification mode to the second power amplifier or supply the fourth bias signal corresponding to the average power tracking amplification mode to the second power amplifier.

14. The radio-frequency circuit according to claim 13, further comprising:

a first output terminal through which the first amplified transmission signal is output; and a second output terminal through which the second amplified transmission signal is output, wherein the first output terminal and the second output terminal are connected to mutually different antennas.

15. The radio-frequency circuit according to claim 13, wherein both the first power amplifier and the second power amplifier are configured to switch from the envelope tracking amplification mode to the average power tracking amplification mode when the value indicating the output power of the first power amplifier or the second power amplifier is greater than the first threshold power.

16. The radio-frequency circuit according to claim 13, wherein one of the first power amplifier or the second power amplifier is configured to switch from the envelope tracking amplification mode to the average power tracking amplification mode when a value indicating the output power of the one of the first power amplifier or the second power amplifier is greater than the first threshold power.

17. The radio-frequency circuit according to claim 13, wherein one of the first power amplifier or the second power amplifier is configured to switch from the envelope tracking amplification mode to the average power tracking amplification mode when a value indicating the output power of the other of the first power amplifier or the second power amplifier is greater than the first threshold power.

18. The radio-frequency circuit according to claim 13, wherein the first power amplifier or the second power amplifier is configured to switch from the average power tracking amplification mode to the envelope tracking amplification mode when a value indicating an output power of the first power amplifier or the second power amplifier is less than a second threshold power.

* * * * *

UNITED STATES PATENT AND TRADEMARK OFFICE
CERTIFICATE OF CORRECTION

| | |
|---|---|
| PATENT NO. | : 11,211,958 B2 |
| APPLICATION NO. | : 16/808540 |
| DATED | : December 28, 2021 |
| INVENTOR(S) | : Shinya Hitomi et al. |

It is certified that error appears in the above-identified patent and that said Letters Patent is hereby corrected as shown below:

In the Specification

Column 12, Line 32, "505" should be – s05 –.

Column 14, Line 67, "505" should be – s05 –.

Column 15, Line 27, "505" should be – s05 –.

Column 15, Line 54, "505" should be – s05 –.

Signed and Sealed this
Sixth Day of September, 2022

Katherine Kelly Vidal
*Director of the United States Patent and Trademark Office*